United States Patent [19]
Barta et al.

[11] 3,954,096
[45] May 4, 1976

[54] METHOD OF WORKING, FORMING AND FINISHING SINGLE CRYSTALS

[75] Inventors: Cestmir Barta, Prague; Oldrich Liska, Decin; Jaroslav Louda, Usti nad Labem; Emil Ryttnauer, Uncin; Jan Zemlicka, Prague, all of Czechoslovakia

[73] Assignee: Ceskoslovenska akademie ved, Prague, Czechoslovakia

[22] Filed: Dec. 3, 1973

[21] Appl. No.: 421,074

[30] Foreign Application Priority Data
Dec. 2, 1972 Czechoslovakia ................. 8231-72

[52] U.S. Cl. .......................................... 125/1; 83/16
[51] Int. Cl.² ......................................... B28D 1/00
[58] Field of Search ............ 125/1, 18; 30/116, 140; 83/16, 171

[56] References Cited
UNITED STATES PATENTS

| | | | |
|---|---|---|---|
| 2,479,926 | 8/1949 | Gravley | 125/1 X |
| 2,771,872 | 11/1956 | Bergling | 30/116 X |
| 3,266,476 | 8/1966 | Swaab | 125/13 R X |
| 3,300,253 | 1/1967 | Hylak | 125/1 X |
| 3,410,979 | 11/1968 | Larsson | 83/16 X |
| 3,527,198 | 9/1970 | Takaoka | 125/30 R |

*Primary Examiner*—Harold D. Whitehead

[57] ABSTRACT

Method of working, forming, and finishing single crystals which are able to sublimate. The single crystal is acted upon by an instrument the temperature of which is the same or higher than the temperature at which the single crystal sublimates.

6 Claims, 3 Drawing Figures

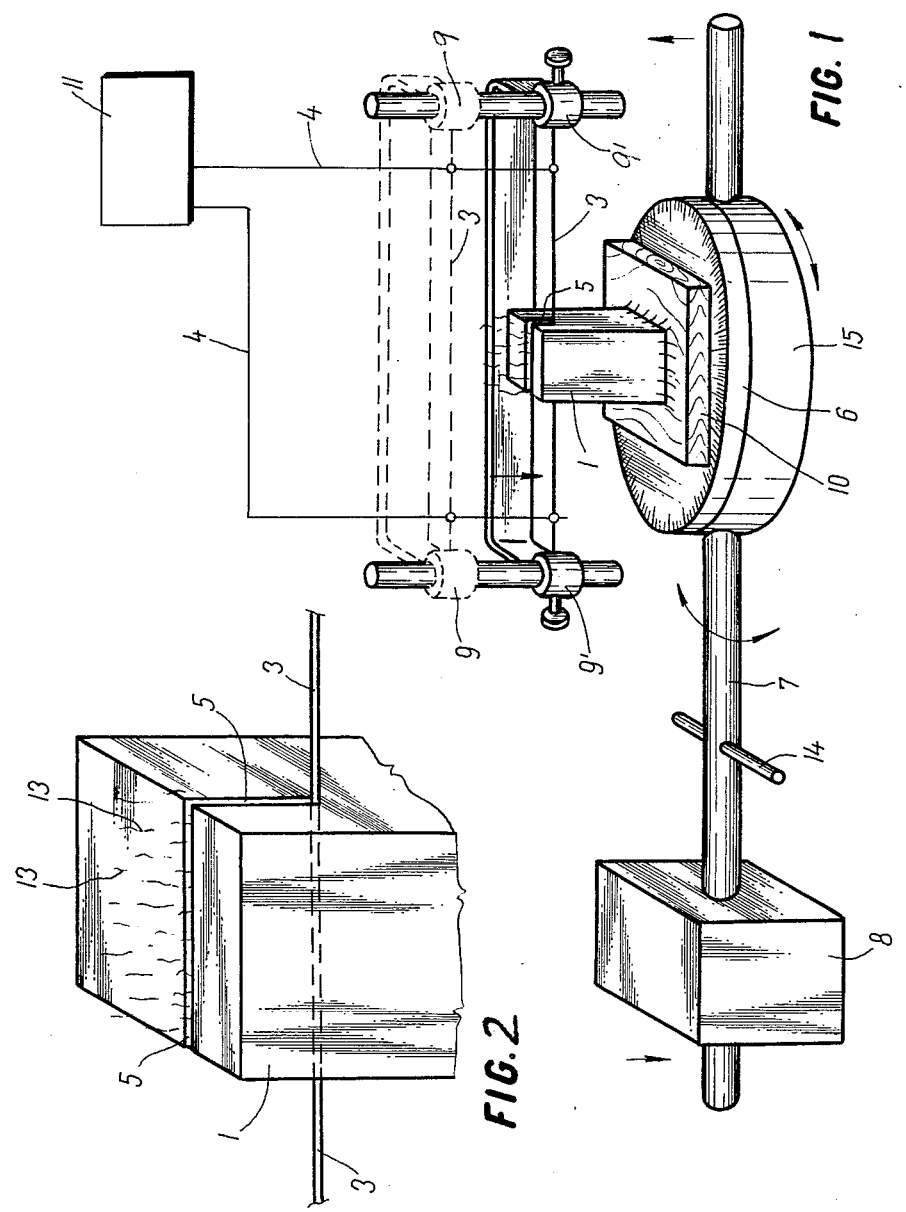

METHOD OF WORKING, FORMING AND FINISHING SINGLE CRYSTALS

This invention relates to the method of working, forming, and finishing single crystals. More exactly this invention relates to the method of forming or final finishing single crystal surfaces of materials which are converted directly to vapor (sublimed) by heat.

In world technology great importance is given to processes in which the form or surface structure of the worked object are changed under the influence of external forces without breaking its integrity; among such processes can be also counted the methods of work at which a part of matter of the worked object is removed without changing the material in a chemical sense.

The whole work done on separation or removing a certain volume of material from the worked object usually consists of one or several partial operations depending on the working process used and on the conditions of work. It may consist e.g. of the work overcoming the plastic deformations, of the work overcoming the elastic deformations, of the work represented by the friction of wasted material on the instrument face and by the friction of the worked surface on the instrument back, of the dispersive work which is consumed upon the formation of a new surface with higher potential energy.

The above-mentioned works are mostly converted into heat which is transferred e.g. from 50 up to 86% into the wasted material, from 10 up to 40% into the instrument, from 3 up to 9% into the worked material, and 1% into the surroundings.

Another shortcoming is a rise of waste of different forms and size while the waste volume coefficient, i.e. a ratio of volume of chips, shavings, powder, etc. produced to a volume of material is e.g. 1:5 up to 1:400. The above-mentioned losses expressed in the relation to a unit of worked material are very relevant, especially in the case when we work with expensive materials as single crystals or even polycrystals.

Moreover, in the case of many single crystals which were worked previously and which exhibit a hardness usually about M=7, no special difficulties arose in cutting, drilling, grinding or polishing. As they manifested a relatively high strength, their surfaces were not damaged by work and therefore the working processes which were known at that time adequately met the given purposes. Nowadays, however, in many cases considerably softer single crystals with e.g. M=2 up to 3 begin to be used; these can be worked by the well-known working methods only with great difficulties. In consequence of considerably lower strength of their matter, even upon cutting and rough grinding the particles of material are broken loose and the structure of single crystals is damaged also in depth. As far as such defect should be removed, a tedious fine grinding and polishing is necessary, which understandably slows down the production and increases the expenses.

For the above-mentioned reasons, experiments have been performed to improve the described processes. Single crystals soluble in water have been cut by thread saws, but the cut-off surfaces were damaged by the influence of water and therefore it was necessary to improve them by grinding and polishing. This method could not have been applied to materials insoluble in water.

Turning of such single crystals could not have been used because of their different strength in the directions of the main axes and with regard to their cleavage. In the case of quartz or precious stones, the rotary forms were therefore made by grinding.

The present invention provides a working process which does not have the disadvantages of the presently known methods of work, and diminishes considerably the amount of solid wast as well as the quantity of energy converted in heat. It excludes completely the unwanted mechanical damage of surface and structure of the worked material. The newly proposed method of work also permits a substantially faster working or finishing of material than the methods known until now.

The method of this invention relates to the working, forming and finishing of single crystals which are able to sublimate. The essence of the invention is a method of working in which a single crystal is affected by an instrument the temperature of which is the same or higher than the temperature at which the single crystal sublimates.

The method of the invention can be used for any kind of working, forming or finishing of single crystals, viz. grinding, cutting, turning, drilling, and polishing, although it is applied with special advantage to grinding, polishing, and cutting.

The instruments used are different according to the working process. For cutting, i.e. for dividing a single crystal into two or more parts, or for the separation of a certain part from a single crystal a thin electrically heated resistance wire is used, such wire moving slowly through the bulk of crystal in the direction of the determined line of separation. At the same time, the wire can either move slowly in one direction or perform an oscillating motion which shifts in the wanted direction. The worked material is pushed against the instrument only by a low pressure sufficient to insure a good mutual touch. In the place of contact between the single crystal and the heated instrument, the material is converted to gas which leaks out through the slit or kerf formed by the heated instrument. The working process is very delicate with respect to the worked material, so that any unwanted surface damage or breaking or destroying of material structure in depth is prevented. In comparison with other known methods of working, the loss of material in this process is relatively small.

The surfaces of the separated material are so smooth that in some cases it is not necessary even to grind the thus created surfaces, which therefore need only to be polished.

The grinding and polishing is performed according to the invention by means of a rotating disc which is heated e.g. electrically and advantageously polished to a high gloss and against which the worked single crystal is pressed. At the same time, the material of projecting unevennesses heated above the sublimation temperature is converted into gas which leaks out; in other case it can condense in adjacent depressions of the surface so the depressions in the ground surface are filled up and contribute to a faster levelling.

Holes passing through the single crystals, or blind holes, are made by means of a hard wire, rod or tube which, being previously heated to a suitable temperature, are forced into the material under a moderate pressure in the direction of axis of the wanted hole.

It is even possible to make rotary solid figures from single crystals by the process according to the present invention as e.g. cylinders, cones, lens etc. when we turn them by means of a tool from a well conducting material heated previously to a suitable temperature.

The advantages of this solution are apparent from the following example which elucidates the essence of the invention without setting limits to it in any way.

EXAMPLE

A single crystal of mercurous chloride ($Hg_2Cl_2$) with a sublimation temperature about 400°C is oriented on a wooden support plate perpendicularly to its optical axis and is then shifted in a protractor stage of a cutting arm (level). The second part of the cutting arm (level) is weighted by a counterweight of about 36 g. As a cutting tool an electrically heated resistance wire 150 mm long and 0.15 mm in diameter is used, the double ends of which are fixed in clips on a reciprocating crosshead driven by a crank mechanism at a frequency of 58 cycles per minute. The cutting wire is heated by means of a regulating transformer to the temperature 520°C at which it is maintained during the whole working period. At the same time, the reciprocating wire is shifted in the direction of the desired cutting, so that a part is cut from a single crystal leaving even and delicate smooth surfaces of 220 $mm^2$ size. The final finish of single crystal surface is performed by polishing.

In the accompanying drawing, illustrating one preferred embodiment of apparatus and method in accordance with the invention:

FIG. 1 has a view in perspective illustrating a preferred embodiment of crystal cutting apparatus in accordance with the invention;

FIG. 2 is an enlarged view in section of the crystal and a portion of the electrical resistance cutting wire in engagement of the crystal;

Figure 3:
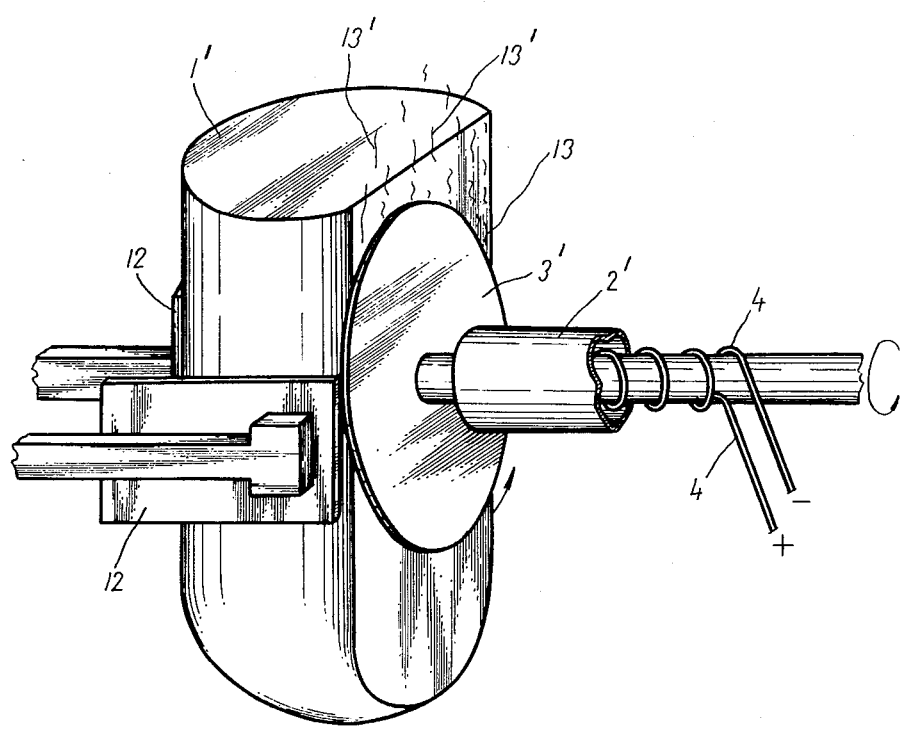
FIG. 3 is a view in perspective of an apparatus illustrating a further embodiment of the method of the invention, wherein the crystal is shaped by a heated rotating disc.

Turning now to FIG. 1, there is there shown a single crystal 1 which is being cut by an electrically heated wire 3. Wire 3 is connected across an electric power supply having lead wires 4 connected to a regulating transformer 11. The action of the electrically heated wire 4 creates a slot or kerf 5 in the crystal, the slot lying in a plane which is determined by the degree of turning of the protractor disc 6 upon which a slab of wood 10 bearing the crystal 5 is mounted. The protractor disc or table 6 is mounted upon a table 15 which in turn is mounted upon a first-class lever pivoted upon a stub shaft 14, the balance weight 8 mounted upon the left-hand end of the lever 7 constantly urges the crystal 1 upwardly into contact with the electrically heated wire 3. The wire 3 is stretched between insulators 9 which are vertically adjustable upon fixed vertical rods, the insulators being shown in phantom lines by the reference charater 9 as they are in their fundamental position before work has begun, and in solid line position where they are designated 9' when they are positioned in the course of processing a single crystal.

In FIG. 3 the enlarged upper end of crystal 1 and of the portion of the electrically heated wire 3 in engagement therewith are shown. Also shown at 13 is the subliming gas of the material of the crystal which is discharged from the slot 5 of the crystal as the electrically heated wire 3 progresses relatively downwardly along the crystal cutting slot 5.

In FIG. 3 there is shown a single crystal, there designated 1', which is held in a crystal mounting device 12. A heated instrument 3' in the form of a driven rotatable disc which is hated by electrically powered resistance wires 4 is mounted for rotation in a tool holder 2' and is thrust against a face of a single crystal. The subliming gas of the material of the crystal is shown at 13'.

Although the invention is illustrated and described with reference to one preferred embodiment thereof, it is to be expressly understood that it is in no way limited to the disclosure of such a preferred embodiment, but is capable of numerous modifications within the scope of the appended claims.

What is claimed is:

1. The method of working a single crystal which sublimates, comprising acting upon the single crystal by a heated instrument the temperature of which is at least the same as the temperature at which the single crystal sublimates, converting the portion of the crystal in the zone thereof in contact with the instrument directly into gas, and permitting the escape of such gas from said zone.

2. Method according to claim 1, wherein the instrument is a cutting tool which forms a kerf in the crystal.

3. Method according to claim 2, wherein the instrument is an electrically heated cutting tool, and comprising feeding the tool in the direction of the desired cut relative to the crystal.

4. Method according to claim 1, wherein the instrument is a heated rod, and comprising forcing the heated rod into the crystal.

5. Method according to claim 1, wherein the instrument is a heated rotating disc, and comprising forcing the disc against the crystal.

6. Method according to claim 2, wherein the cutting tool is elongated, and comprising reciprocating the cutting tool in the direction of its length with respect to the crystal.

* * * * *